(12) United States Patent
Kato et al.

(10) Patent No.: US 8,465,663 B2
(45) Date of Patent: Jun. 18, 2013

(54) COMPOSITION FOR ELECTROMAGNETIC WAVE SUPPRESSION AND HEAT RADIATION AND METHOD FOR MANUFACTURING COMPOSITION FOR ELECTROMAGNETIC WAVE SUPPRESSION AND HEAT RADIATION

(75) Inventors: Yoshihiro Kato, Kanagawa (JP); Kazuhiko Suzuki, Kanagawa (JP); Tatsuo Kumura, Miyagi (JP); Yusuke Kubo, Tochigi (JP)

(73) Assignee: Sony Corporation, Tokyo (JP)

( * ) Notice: Subject to any disclaimer, the term of this patent is extended or adjusted under 35 U.S.C. 154(b) by 608 days.

(21) Appl. No.: 12/696,281

(22) Filed: Jan. 29, 2010

(65) Prior Publication Data
US 2010/0200796 A1    Aug. 12, 2010

(30) Foreign Application Priority Data
Feb. 9, 2009    (JP) ................. 2009-027744

(51) Int. Cl.
*H05K 9/00*    (2006.01)
*H01F 1/00*    (2006.01)

(52) U.S. Cl.
USPC ............. 252/62.54; 523/137; 252/62.55; 252/62.53

(58) Field of Classification Search
USPC ........... 252/62, 54, 52.53, 62.55; 523/137
See application file for complete search history.

(56) References Cited

U.S. PATENT DOCUMENTS

| 7,030,172 B2 * | 4/2006 | Sakurai | 523/137 |
| 2007/0196671 A1 * | 8/2007 | Kobayashi | 428/447 |

FOREIGN PATENT DOCUMENTS

| JP | 2002-371138 | | 12/2002 |
| JP | 2003-209010 | | 7/2003 |
| JP | 2003-318015 | | 11/2003 |
| JP | 2003-332113 | | 11/2003 |
| JP | 2006-196747 | * | 7/2006 |
| JP | 2006-310812 | | 11/2006 |

* cited by examiner

*Primary Examiner* — Carol M Koslow
(74) *Attorney, Agent, or Firm* — Dentons US LLP

(57) ABSTRACT

A composition for electromagnetic wave suppression and heat radiation includes: a matrix composed of a high molecular material or a low molecular material; and a magnetic particle filled in the matrix upon mixing a magnetic powder having a relation of {(tap density)/density}≧0.58 with the matrix.

21 Claims, 5 Drawing Sheets

POLYALKYLALKENYLSILOXANE

FIG.4

POLYALKYL HYDROGEN SILOXANE

COMPOSITION FOR ELECTROMAGNETIC WAVE SUPPRESSION AND HEAT RADIATION AND METHOD FOR MANUFACTURING COMPOSITION FOR ELECTROMAGNETIC WAVE SUPPRESSION AND HEAT RADIATION

BACKGROUND OF THE INVENTION

1. Field of the Invention

The present invention relates to a composition for electromagnetic wave suppression and heat radiation and to a method for manufacturing the same. More specifically, the present invention relates to a composition for electromagnetic wave suppression and heat radiation for not only suppressing an electromagnetic wave emitted within, for example, an electronic appliance but efficiently achieving heat radiation and to a method for manufacturing the same.

2. Description of the Related Art

Though electronic appliances provided with diverse applications have been developed so far, in recent years, the size of such an electronic appliance tends to become smaller. However, even when the electronic appliance becomes small in size, it is required to cope with the diversity of applications, and therefore, the electric energy (calorific value) used in the electronic appliance does not change so much. For that reason, in recent years, a heat radiation measure within an electronic appliance is much more regarded as important.

As the heat radiation measure (heat measure) within an electronic appliance, heat radiation members such as a heat radiation plate, a heat pipe or a heat sink, each made of a metallic material with a high coefficient of thermal conductivity, for example, copper, aluminum, etc., are widely utilized. Such a heat radiation member with excellent thermal conductivity is in general disposed in a heat generating part (high-temperature area) within an electronic appliance, or disposed within an electronic appliance so as to link a heat generating part (high-temperature area) and a low-temperature area to each other. On that occasion, the heat radiation member and the heat generating part or the like are connected to each other via a highly thermally conductive filler (for example, a heat radiation sheet, etc.). The heat radiation or temperature relaxation within an electronic appliance has hitherto been contrived in such a way.

However, since such a heat radiation member is formed of a metallic material, there is caused, as a side effect, a problem that a harmonic component of an electric signal within the electronic appliance propagates through the heat radiation member, and as a result, an unnecessary electromagnetic wave is radiated from the heat radiation member. Its situation is shown in FIG. 9.

Figure 9:
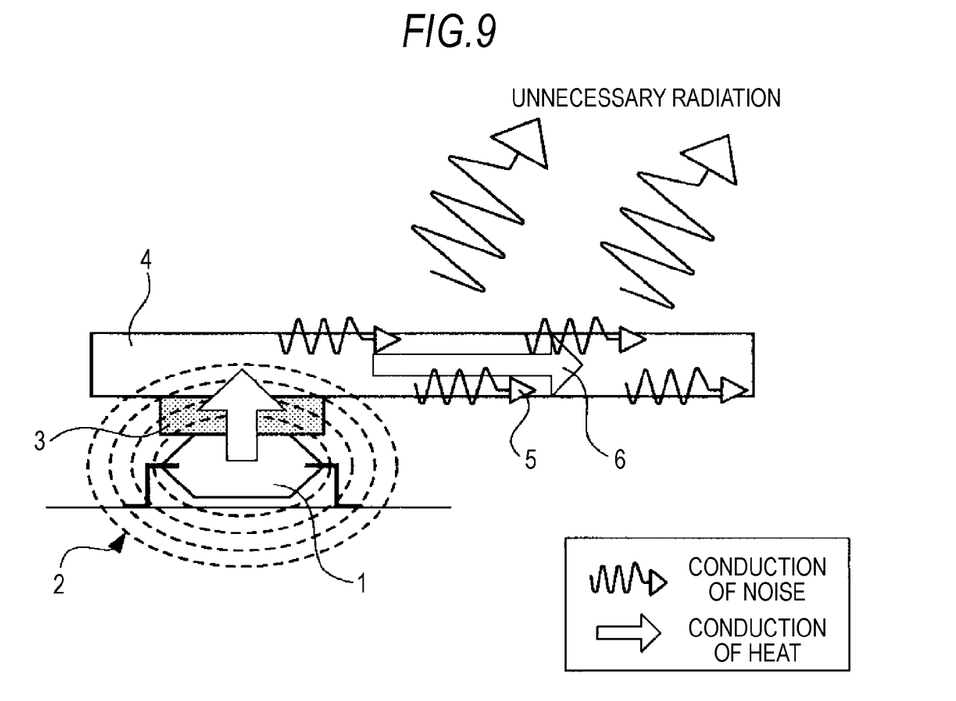
FIG. 9 is a view showing the situation of transfer of heat and a noise in the case of providing a heat radiation sheet between a heat generating part and a heat radiation member.

As shown in FIG. 9, when a heat radiation sheet (thermally conductive sheet) 3 is provided between a heat generating part 1 and a metal-made heat radiation member 4 such as a heat sink, heat 6 generated in the heat generating part 1 is transferred into the heat radiation member 4 via the heat radiation sheet and radiated. However, the heat generating part (high-temperature area) 1 within the electronic appliance is mainly configured of a semiconductor device (semiconductor package) with a high current density and the like. That is, the heat generating part 1 with a high current density is an area where an electric field intensity or a magnetic field intensity which may possibly cause heat radiation of an unnecessary electromagnetic wave is large. Therefore, when the heat radiation member 4 is disposed in the vicinity of the heat generating part 1, a magnetic field 2 emitted from the heat generating part 1 and the heat radiation member 4 are coupled with each other, whereby an electromotive force is generated in the heat radiation member 4, and a harmonic noise component 5 is generated. As a result, not only the heat 6 but the harmonic noise component 5 of an electric signal propagates into the heat radiation member 4. That is, the heat radiation member 4 becomes a transfer route of the harmonic noise component 5. On that occasion, since the heat radiation member 4 is made of a metal, there is generated a phenomenon in which the heat radiation member 4 acts as an antenna, thereby radiating the propagated harmonic noise component 5 as an electromagnetic wave toward the outside.

In order to reduce such a heat radiation phenomenon of an unnecessary electromagnetic wave, there has hitherto been proposed a technique for breaking coupling of the magnetic field between the heat generating part 1 and the heat radiation member 4 using an electromagnetic wave suppressing sheet or an electromagnetic wave suppressing sheet having heat radiation properties in place of the heat radiation sheet (see, for example, JP-A-2006-196747, JP-A-2003-209010, JP-A-2003-332113 and JP-A-2002-371138).

In JP-A-2006-196747, JP-A-2003-209010 and JP-A-2003-332113, an electromagnetic wave suppressing sheet is proposed. Such an electromagnetic wave suppressing sheet is configured of a sheet matrix such as a resin or a rubber and a magnetic particle with a high magnetic permeability, which is filled in the inside thereof, such as ferrite. In the electromagnetic wave suppressing sheet, for example, a magnetic field generated from the heat generating part is absorbed by this magnetic particle, thereby suppressing the radiation of an unnecessary electromagnetic wave.

Also, in JP-A-2002-371138, an electromagnetic wave suppressing sheet having heat radiation properties (hereinafter referred to as "electromagnetic wave suppressing and heat radiating sheet") is proposed. In general, the electromagnetic wave suppressing and heat radiating sheet is prepared by mixing a powder for heat radiation with a high coefficient of thermal conductivity, such as alumina or aluminum nitride and a magnetic powder with a high magnetic permeability, such as ferrite, with, for example, a silicone based or acrylic polymer material (for example, resins or rubbers). That is, in the magnetic wave suppressing and heat radiating sheet, by filling a powder for heat radiation (heat radiating filler) and a magnetic powder (magnetic filler) in a matrix, a heat radiation action and an electromagnetic wave suppression action (decoupling action of the magnetic field) are made compatible with each other by a single sheet.

Figure 10:
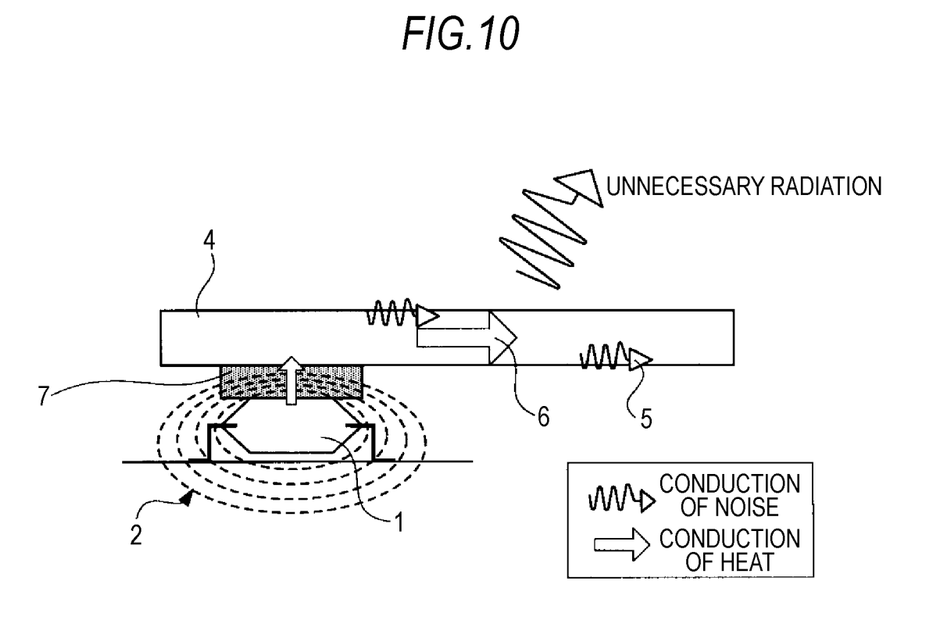
FIG. 10 is a view showing the situation of transfer of heat and a noise in the case of providing an electromagnetic wave suppressing and heat radiating sheet between a heat generating part and a heat radiation member.

FIG. 10 shows the situation of propagation of heat and a harmonic noise signal in the case where the foregoing electromagnetic wave suppressing and heat radiating sheet is provided between the heat generating part 1 and the heat radiation member 4. In that case, the magnetic field 2 generated from the heat generating part 1 is absorbed by an electromagnetic wave suppressing and heat radiating sheet 7, and the harmonic noise component 5 generated in the heat radiation member 4 is reduced, too.

SUMMARY OF THE INVENTION

A heat radiation effect and an electromagnetic wave suppression effect of the electromagnetic wave suppressing and heat radiating sheet are largely influenced by not only physical properties of a material capable of giving each of the effects (this material will be hereunder referred to as "target material") but the filling amount of the target material which is contained in a matrix. In general, as the filling amount of the target material becomes high, the effect obtained by the target material increases.

However, in fact, in preparing the electromagnetic wave suppressing and heat radiating sheet, there is caused a problem that when a matrix composed of, for example, a resin, a rubber or the like is merely mixed with an arbitrary powder for heat radiation and/or an arbitrary magnetic powder (target powder), there is a limit in the filling amount of such a target material. This problem is hereunder specifically described.

In heat radiation sheets which are commercially available at present or the like, for example, a spherical powder for heat generation, a crushed powder for heat radiation or the like is used as the powder for heat radiation (thermally conductive powder) to be mixed with the matrix. Also, in electromagnetic wave suppressing sheets which are commercially available at present or the like, for example, a flat magnetic powder (see, for example, JP-A-2003-209010 and JP-A-2003-332113), a crushed magnetic powder or the like is used as the magnetic powder. Here, the case of preparing an electromagnetic wave suppressing and heat radiating sheet by mixing these target powders with a matrix composed of, for example, a resin, a rubber or the like is considered.

For example, in the case of mixing a spherical powder for heat radiation and a flat magnetic powder with a matrix, the shapes of these target powders are different from each other. Therefore, it is difficult to subject these target materials to closest packing in the sheet by a simple mixing process of merely kneading the matrix and the target powders. Also, in the case of mixing the crushed powder for heat radiation and the crushed magnetic powder with the matrix, since each of these crushed target powders has a diverse concave-convex shape, it is difficult to subject these target materials to closest packing in the sheet. For these reasons, in the case of preparing an electromagnetic wave suppressing and heat radiating sheet by a simple mixing process of merely kneading the powder for heat radiation and the magnetic powder with the matrix, there is a limit in the amount of each of the thermally conductive material and the magnetic material, which can be filled in the sheet. Also, even in the case of filling only the magnetic powder in the matrix, since the powder has a diverse shape, the same problem is caused.

Thus, it is desirable to provide a composition for electromagnetic wave suppression and heat radiation having excellent characteristics in both of an electromagnetic wave suppression effect and a heat radiation effect by filling larger amounts of target materials in a matrix.

A composition for electromagnetic wave suppression and heat radiation according an embodiment of the present invention is constituted of a matrix composed of a high molecular material or a low molecular material and a magnetic particle filled in the matrix upon mixing a magnetic powder having a relation of $\{(tap\ density)/density\} \geqq 0.58$ with the matrix.

A method for manufacturing a composition for electromagnetic wave suppression and heat radiation according to an embodiment of the present invention is carried out in the following procedures. First of all, a magnetic powder having a relation of $\{(tap\ density)/density\} \geqq 0.58$ is prepared. Subsequently, the magnetic powder is mixed with a matrix composed of a high molecular material or a low molecular material.

As described previously, in the embodiments according to the present invention, the magnetic powder having a relation of $\{(tap\ density)/density\} \geqq 0.58$ is mixed with the matrix, thereby preparing the composition for electromagnetic wave suppression and heat radiation. According to this, a larger amount of the magnetic particle can be filled in the matrix as compared with the related art.

The "composition for electromagnetic wave suppression and heat radiation" as referred to in this specification includes not only a composition in which the magnetic particle and the thermally conductive particle are filled in the matrix but a composition in which only the magnetic particle is filled in the matrix. This is because as described later, even in the case where only the magnetic particle is filled in the matrix, the heat radiation effect is enhanced in the embodiments according to the present invention as compared with, for example, electromagnetic wave suppressing sheets of the related art, etc.

Also, in this specification, the magnetic material prior to mixing with the matrix is referred to as "magnetic powder"; and the magnetic material after mixing with the matrix is referred to as "magnetic particle". Similarly, the thermally conductive material for heat radiation promotion prior to mixing with the matrix is referred to as "thermally conductive powder (powder for heat radiation)"; and the thermally conductive material after mixing with the matrix is referred to as "thermally conductive particle (particle for heat radiation)".

According to the embodiments of the present invention, a larger amount of the magnetic particle can be filled in the inside of the matrix as compared with the related art, and therefore, it becomes possible to provide a composition for electromagnetic wave suppression and heat radiation which is excellent in both of a heat radiation effect and an electromagnetic wave suppression effect.

DESCRIPTION OF THE PREFERRED EMBODIMENTS

Examples of a composition for electromagnetic wave suppression and heat radiation and a method for manufacturing the same according to embodiments of the present invention are hereunder described in the following order. But, it should not be construed that the present invention is limited thereto.
1. Basic constitutional example of composition for electromagnetic wave suppression and heat radiation
2. Example 1: Electromagnetic wave suppressing and heat radiating sheet containing magnetic particle
3. Example 2: Electromagnetic wave suppressing and heat radiating sheet containing magnetic particle and thermally conductive particle

1. Basic Constitutional Example of Composition for Electromagnetic Wave Suppression and Heat Radiation The composition for electromagnetic wave suppression and heat radiation according to an embodiment of the present invention is prepared by mixing a matrix composed of a high molecular material or a low molecular material with a magnetic powder having a relation of {(tap density)/density}≧0.58. Here, a parameter {(tap density)/density} of the magnetic powder is first described.

[{(Tap Density)/Density} of Magnetic Powder]

According to the embodiment of the present invention, in the composition for electromagnetic wave suppression and heat radiation, in order to enhance both effects including a heat radiation effect and an electromagnetic wave suppression effect by increasing the filling amount of a magnetic particle, attention is paid to a powder shape of the magnetic powder to be mixed with the matrix. For example, in a simple mixing process by kneading the matrix and the magnetic powder, in order to increase the filling amount of the magnetic particle, it is preferable to make the shape of the magnetic powder closer to a sphere. However, in fact, it is difficult to measure the shape of each of the powders in the magnetic powder. Also, in the field regarding a composition for electromagnetic wave suppression and heat radiation, a definition of the sphere (degree of sphericity) of a magnetic powder or an optimal degree of sphericity has not been discussed up to date.

Then, in the embodiment according to the present invention, a {(tap density)/density} ratio of the magnetic powder is used as a parameter for expressing the degree of sphericity of the magnetic powder. The tap density is a density of the powder after, for example, packing a powder in a certain container and giving a vibration to the container or tapping it. Therefore, as the shape of the powder becomes closer to a sphere, the filling amount of the powder to be filled in the container increases, and the tap density becomes high. That is, the higher the degree of sphericity of the powder, the higher the {(tap density)/density} ratio of the powder.

The present inventors prepared electromagnetic wave suppressing and heat radiating sheets by diversely changing the {(tap density)/density} ratio of a magnetic powder and examined thermal conductivity and magnetic wave suppressing and heat radiating characteristics of each of the sheets. Details thereof are described in Examples 1 and 2 as described later. As a result, it has been understood that by regulating the {(tap density)/density} ratio of a magnetic powder at 0.58 or more, excellent characteristics in both of a heat radiation effect and an electromagnetic wave suppression effect are obtainable. That is, in the embodiment according to the present invention, by regulating the {(tap density)/density} ratio of the magnetic powder to be mixed with the matrix at 0.58 or more, both of the foregoing thermal problem and an EMC (electromagnetic compatibility) problem can be solved.

Also, the method for preparing a composition for electromagnetic wave suppression and heat radiation according to the embodiment of the present invention is a simple technique because the magnetic powder having a relation of {(tap density)/density}≧0.58 is merely mixed with the matrix. Also, the preparation of a powder is relatively easy because it is enough to merely designate the {(tap density)/density} ratio of the magnetic powder at the time of preparing a powder. Therefore, in the embodiment according to the present invention, a composition for electromagnetic wave suppression and heat radiation which is excellent in both of a heat radiation action and an electromagnetic wave suppression action can be prepared by a simpler method.

An upper limit value of the parameter {(tap density)/density} of the magnetic powder is theoretically 1. However, for example, taking into consideration the current powder manufacturing technologies and the like, the upper limit value of the {(tap density)/density} ratio is from about 0.8 to 0.9 under the existing circumstances.

In the composition for electromagnetic wave suppression and heat radiation according to the embodiment of the present invention, the powder to be mixed with the matrix may be only a magnetic powder (see Example 1 as described later). Even in the case where only the magnetic powder is mixed with the matrix, in the embodiment according to the present invention, when the relation of {(tap density)/density}≧0.58 is satisfied, a larger amount of the magnetic particle can be filled in the matrix. Therefore, the heat radiation effect is enhanced as compared with that in the related-art electromagnetic wave suppressing sheets containing only a magnetic particle.

Also, in the embodiment according to the present invention, in order to more increase the coefficient of thermal conductivity of the composition for electromagnetic wave suppression and heat radiation, the thermally conductive powder for heat radiation promotion (powder for heat radiation) may be mixed with the matrix together with the magnetic powder (see Example 2 as described later). On that occasion, it is preferable to use a thermally conductive powder which is satisfied with a relation of {(tap density)/density}≧0.58. By mixing the thermally conductive powder with the matrix so as to be satisfied with this relation, the filling amount of the thermally conductive particle can be increased, and the heat radiation effect of the composition for electromagnetic wave suppression and heat radiation can be more enhanced.

[Constitutional Materials of Composition for Electromagnetic Wave Suppression and Heat Radiation]

As the matrix of the composition for electromagnetic wave suppression and heat radiation according to the embodiment of the present invention, for example, silicone based, acrylic or epoxy based high molecular materials or low molecular materials (for example, resins, rubbers, etc.) can be used.

Also, as the magnetic powder of the composition for electromagnetic wave suppression and heat radiation according to the embodiment of the present invention, arbitrary materials can be used so far as they are a material having a large magnetic characteristic (magnetic permeability characteristic) and capable of being satisfied with a relation of {(tap density)/density}≧0.58. Specifically, for example, magnetic metal amorphous powders having boron (B) or carbon (C) added thereto, crystallized metal powders, metal alloy powders, ferrite powders and the like can be used as the magnetic powder.

As the magnetic metal amorphous powder, for example, Fe—Si—B based, Fe—Si—B—C based or Co—Si—B based powders can be used.

As the crystallized metal powder, for example, Fe based, Co based or Ni based powders can be used. Also, as the metal alloy powder, for example, Fe—Ni based, Fe—Co based, Fe—Al based, Fe—Si based or Fe—Si—Al based powders can be used. Each of these powders may be used singly or in combinations of plural kinds thereof.

Also, as the ferrite powder, for example, powders of an iron based oxide such as Mn—Zn based ferrite, Ni—Zn based ferrite, Cu—Zn based ferrite, Cu—Mg—Zn based ferrite, Mn—Mg—Al based ferrite, YIG based ferrite or Ba based ferrite can be used. However, it should not be construed that the magnetic powder which can be used in the embodiment according to the present invention is limited to the foregoing materials.

Also, in the case of further mixing the powder for heat radiation (thermally conductive powder), for example, powders of a highly thermally conductive ceramic such as alumina, boron nitride, silicon nitride, aluminum nitride or silicon carbide can be used as the powder for heat radiation. Also, metal powders of, for example, copper, aluminum, etc., powders of a metal powder of, for example, copper, aluminum, etc. coated with an insulating material, and the like may also be used as the powder for heat radiation. Each of these powders may be used singly or in combinations of plural kinds thereof. Also, it is preferable to use a material having a coefficient of thermal conductivity of 10 W/mK or more as the powder for heat radiation. However, it should not be construed that the powder for heat radiation which can be used in the embodiment according to the present invention is limited to these materials.

[Use Form of Composition for Electromagnetic Wave Suppression and Heat Radiation]

As to the use form of the composition for electromagnetic wave suppression and heat radiation, a paste form, a gel form or the like may be used. Also, the composition for electromagnetic wave suppression and heat radiation may be formed in a molded article, for example, a sheet, etc. Such a form can be realized by properly selecting a material of the matrix depending upon an application of the composition for electromagnetic wave suppression and heat radiation.

In the case where the use form of the composition for electromagnetic wave suppression and heat radiation is a paste form, the composition for electromagnetic wave suppression and heat radiation can be used upon being injected between solid members, for example, between a semiconductor package within an electronic appliance and a heat sink member (for example, a heat radiation plate, etc.). In that case, the composition for electromagnetic wave suppression and heat radiation can also be used as a sealing material of, for example, a flip chip, etc.

Also, in the case where the use form of the composition for electromagnetic wave suppression and heat radiation is a gel form, the composition for electromagnetic wave suppression and heat radiation can be applied to, for example, an area within an electronic appliance where shock absorption properties are required.

Furthermore, in the case where the use form of the composition for electromagnetic wave suppression and heat radiation is a molded article, the composition for electromagnetic wave suppression and heat radiation can be used in a state that it is processed into an arbitrary shape. For example, in the case of molding the composition for electromagnetic wave suppression and heat radiation in a sheet form, the sheet can be used upon being stuck directly to a semiconductor package, a substrate or the like. In the case where the composition for electromagnetic wave suppression and heat radiation according to the embodiment of the invention is configured as a sheet, the following effects are also obtainable.

As described previously, for example, in electromagnetic wave suppressing and heat radiating sheets which are commercially available at present, for example, a flat magnetic powder, a crushed magnetic powder or the like can be used as the magnetic powder to be mixed with the matrix. Also, for example, a spherical thermally conductive powder, a crushed thermally conductive powder or the like can be used as the thermally conductive powder. Therefore, in the case of mixing these powders with the matrix to prepare a sheet, when the filling amounts of these target particles are high, the inside of the sheet becomes in a state that the particles having a diverse concave-convex shape come into close contact with each other, and therefore, it becomes difficult to obtain sufficient flexibility of the sheet.

The foregoing flexibility issue is more specifically described. Now, for example, the case of mixing a resin for forming the matrix and a flat magnetic powder to prepare an electromagnetic wave suppressing and heat radiating sheet is considered. In that case, first of all, the flat particle in the resin is rendered in a state that it is aligned within the sheet plane. Subsequently, the mixture of the resin and the flat powder is extruded while applying a pressure to some extent, thereby molding the mixture in a sheet form. According to this manufacturing method, when the filling amount of the magnetic particle (flat particle) is high, an electromagnetic wave suppressing and heat radiating sheet in which the flat particle is arranged in a layered state in an in-plane direction of the sheet is obtained, and a magnetic characteristic (magnetic permeability) of the sheet can be enhanced. However, the electromagnetic wave suppressing and heat radiating sheet having such a configuration takes a structure in which the resin and the magnetic particle are overlaid in a layered state, and therefore, the flexibility of the sheet is lowered. Also, in the electromagnetic wave suppressing and heat radiating sheet having such a layered structure, the resin with a low coefficient of thermal conductivity is present as a layer in a thickness direction of the sheet, and therefore, heat resistance in a thickness direction of the sheet becomes large.

On the contrary, in the embodiment according to the present invention, since the magnetic powder having substantially the same shape (spherical shape) or the magnetic powder and the thermally conductive powder are mixed with the matrix, a layer of the resin and the magnetic particle is not formed in the inside of the electromagnetic wave suppressing and heat radiating sheet. Therefore, in the electromagnetic wave suppressing and heat radiating sheet according to the embodiment of the present invention, the thermal conductivity and the flexibility in a thickness direction of the sheet can be enhanced as compared with the related art. Also, in the embodiment according to the present invention, since the alignment treatment of the magnetic particle as in the related art becomes unnecessary, the electromagnetic wave suppressing and heat radiating sheet can be more simply prepared.

2. Example 1

Next, an example of the actually prepared composition for electromagnetic wave suppression and heat radiation (Example 1) is described. In Example 1, as shown in, for example, FIG. 10, an electromagnetic wave suppressing and heat radiating sheet to be provided between the heat generating part 1 and the heat radiation member 4 was prepared.

Figure 1:
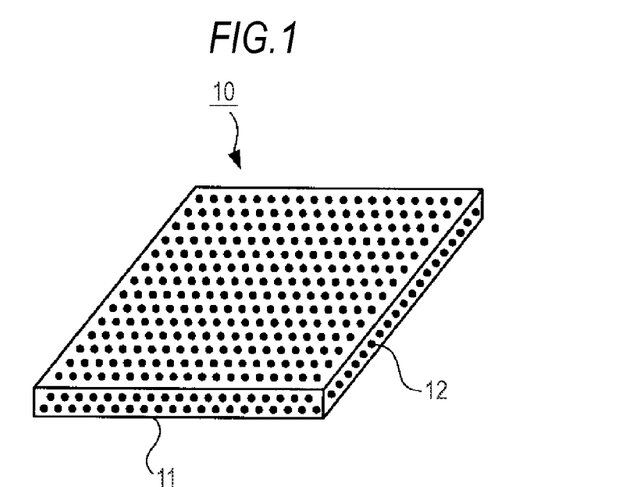
FIG. 1 is a diagrammatic configuration view of an electromagnetic wave suppressing and heat radiating sheet of Example 1 according to an embodiment of the present invention.

FIG. 1 shows a diagrammatic configuration of the electromagnetic wave suppressing and heat radiating sheet of Example 1. An electromagnetic wave suppressing and heat radiating sheet 10 is configured to include a sheet matrix 11 (matrix) having a substantially spherical magnetic grain 12 filled therein. In Example 1, an example in which only the magnetic particle 12 is filled in the sheet matrix 11 is described.

[Preparation Method of Electromagnetic Wave Suppressing and Heat Radiating Sheet]

Figure 2:
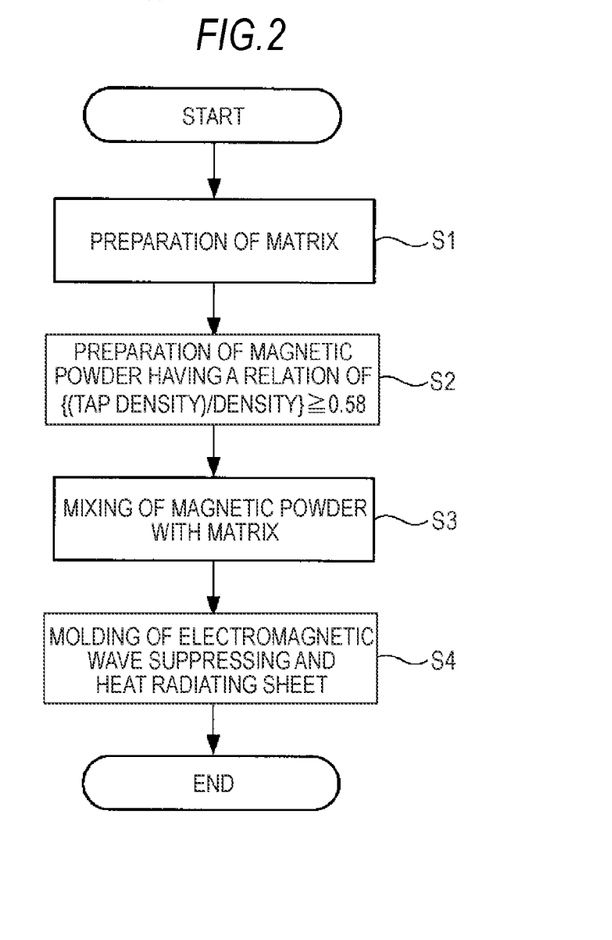
FIG. 2 is a flowchart showing preparation procedures of an electromagnetic wave suppressing and heat radiating sheet of Example 1.

A preparation method of the electromagnetic wave suppressing and heat radiating sheet 10 of Example 1 is described with reference to FIG. 2. FIG. 2 is a flowchart showing preparation procedures of the electromagnetic wave suppressing and heat radiating sheet 10 of this Example 1.

Figure 3:
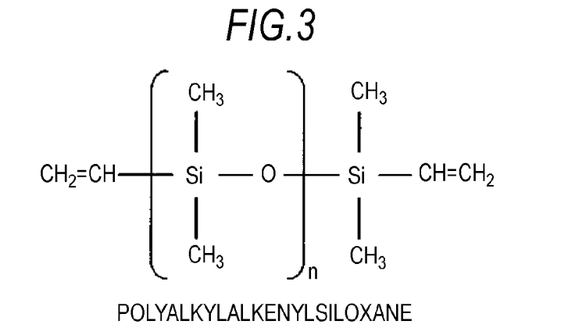
FIG. 3 is a chemical formula of a polyalkylalkenylsiloxane contained in a matrix using an electromagnetic wave suppressing and heat radiating sheet of Example 1.
Figure 4:
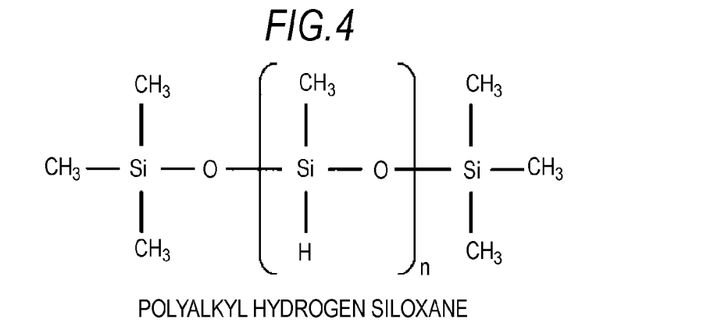
FIG. 4 is a chemical formula of a polyalkyl hydrogen siloxane contained in a matrix using an electromagnetic wave suppressing and heat radiating sheet of Example 1.

First of all, a silicone based resin which is a mixture of a polyalkylalkenylsiloxane, a polyalkyl hydrogen siloxane and a platinum compound is prepared as a matrix (Step S1). Here, chemical formulae of the polyalkylalkenylsiloxane and the polyalkyl hydrogen siloxane are shown in FIGS. 3 and 4, respectively.

Subsequently, a magnetic powder having a relation of {(tap density)/density} ≧ 0.58 is prepared (Step S2). In Example 1, a magnetic metal amorphous powder having a density (true density) of 7 g/cm$^3$ and a tap density of 4.4 g/cm$^3$, namely a {(tap density)/density} ratio of approximately 0.63 was used. Also, the magnetic powder had an average particle size of about 10 μm.

Subsequently, the matrix and the magnetic powder are mixed using a vacuum stirrer (Step S3). Then, the mixed material is molded into a sheet having a prescribed thickness (Step S4).

A specific treatment of the Step S4 is as follows. First of all, the mixed material of the matrix and the magnetic powder is formed in a sheet form having a prescribed thickness by using a roller. Subsequently, the mixed material in a sheet form is cured upon being heated at about 100° C. In Example 1, there is thus prepared the electromagnetic wave suppressing and heat radiating sheet 10.

[Evaluation of Characteristics of Electromagnetic Wave Suppressing and Heat Radiating Sheet]

(1) Evaluation of Maximum Filling Amount of Magnetic Particle:

In Example 1, various electromagnetic wave suppressing and heat radiating sheets were prepared according to the foregoing preparation method while diversely changing the amount of the magnetic powder, and a maximum filling amount of the magnetic particle was examined. The amount of the matrix was regulated at a fixed amount.

The maximum filling amount of the magnetic particle was measured in the following manner. First of all, in a preparation process of the electromagnetic wave suppressing and heat radiating sheet, whether or not the magnetic powder which has not been mixed with the matrix after vacuum stirring (Step S3 in FIG. 2) remains is confirmed. Alternatively, in molding the mixed material in a sheet form by a roller (Step S4 in FIG. 2), whether or not the mixed material comes to pieces (whether the formation into a sheet is possible or impossible) is confirmed. Then, the case where the magnetic powder remained after the Step S3, or the case where the mixed material came to pieces after the Step S4, is determined such that mixing of the matrix and the magnetic powder is impossible. Then, a maximum amount of the magnetic powder which could be mixed (possible for the formation into a sheet) is defined as the maximum filling amount of the magnetic particle.

As a result of the foregoing measurement, the maximum filling amount of the magnetic particle of the electromagnetic wave suppressing and heat radiating sheet of Example 1 was found to be about 70.9 vol %. For example, taking into consideration the fact that in subjecting spheres having a uniform size to closest packing, a theoretical filling factor is n/(3·2$^{1/2}$) (≅0.74), it is understood that in the electromagnetic wave suppressing and heat radiating sheet of this Example 1, a sufficiently high filling amount of the magnetic particle is obtained.

Here, for the purpose of comparison with Example 1, electromagnetic wave suppressing and heat radiating sheets were prepared in the same manner as in Example 1 by using three kinds of existing magnetic powders which are commercially available or the like (Comparative Example: Samples A to C), and the maximum filling amount at the time of using each of the various magnetic powders was measured. As to the {(tap density)/density} ratio of the magnetic powders of Samples A to C, powders having an average particle size of about 10 μm, a value of which is similar to that in Example 1, were used. Also, a matrix the same as that in Example 1 was used. As a result, the maximum filling amount of Samples A to C were about 60.2 vol %, about 63.1 vol % and about 62.2 vol %, respectively.

The density, tap density and {(tap density)/density} ratio of each of the magnetic powders used in Example 1 and Comparative Example and the maximum filling amount of each of the magnetic particles used in Example 1 and Comparative Example are summarized in the following Table 1. Sample D in Table 1 is the magnetic powder of Example 1.

TABLE 1

| Sample | Density [g/cm$^3$] | Tap density [g/cm$^3$] | (Tap density)-/density | Maximum filling amount [vol %] |
|---|---|---|---|---|
| A (Comparison) | 8.2 | 4.5 | 0.549 | 60.2 |
| B (Comparison) | 7.1 | 4.0 | 0.563 | 63.1 |
| C (Comparison) | 7.6 | 4.3 | 0.566 | 62.2 |
| D (Example 1) | 7.0 | 4.3 | 0.629 | 70.9 |

Figure 5:
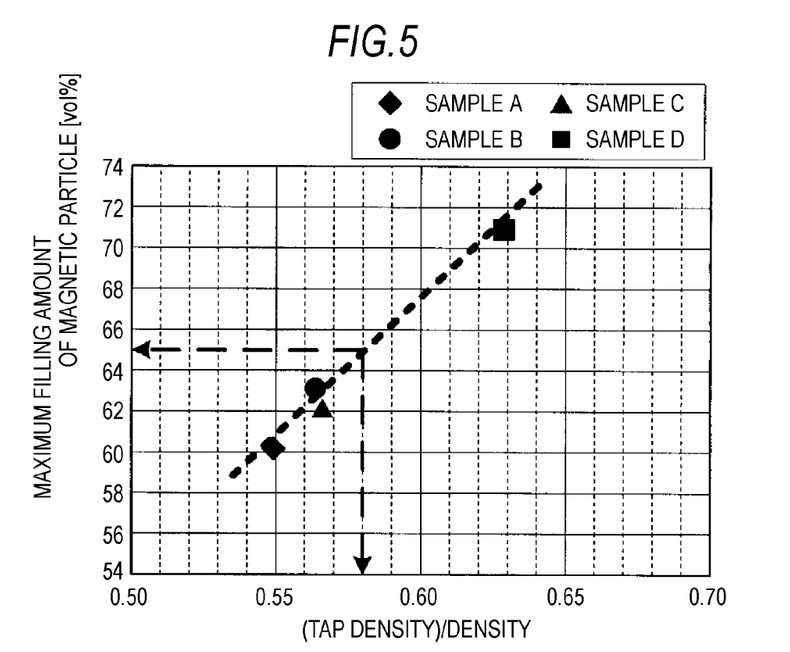
FIG. 5 is a graph showing a relation between a $\{(tap\ density)/density\}$ ratio of a magnetic powder and a maximum filling amount of a magnetic particle in an electromagnetic wave suppressing and heat radiating sheet of each of Example 1 and Comparative Example.

Also, FIG. 5 shows a characteristic expressing a relation between the parameter {(tap density)/density} and the maximum filling amount in the foregoing Table 1. The abscissa of the characteristic shown in FIG. 5 is a {(tap density)/density} ratio, and the ordinate is a maximum filling amount. As is clear from the foregoing Table 1 and FIG. 5, it is understood that as the {(tap density)/density} ratio of the magnetic powder increases, the maximum filling amount of the magnetic particle linearly increases.

(2) Evaluation of Heat Radiation Effect:

Next, a relation between the maximum filling amount and the heat radiation effect (coefficient of thermal conductivity) of the magnetic particle is described.

Figure 6:
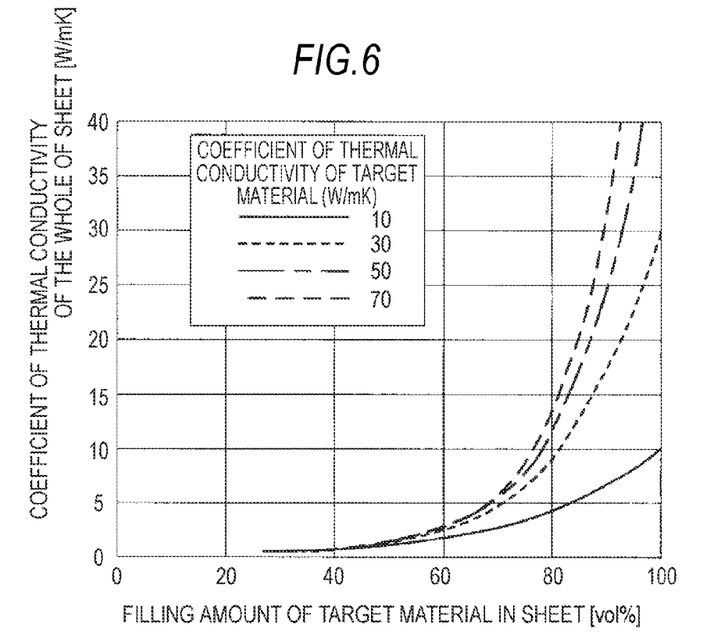
FIG. 6 is a graph showing a relation between a filling amount of a target particle in a sheet and a coefficient of thermal conductivity of the whole of the sheet.

In general, the heat radiation effect of the sheet containing a thermally conductive material is influenced by a filling factor of the thermally conductive material (corresponding to the magnetic particle in Example 1). A relation between the filling amount of the thermally conductive material in the sheet and the coefficient of thermal conductivity of the whole of the sheet is expressed as follows according to the Bruggeman's expression.

$$1 - \varphi = \frac{\lambda - \lambda_d}{\lambda_c - \lambda_d} \left(\frac{\lambda_c}{\lambda}\right)^{1/3} \quad (1)$$

In the foregoing expression (1), $\lambda$ represents a coefficient of thermal conductivity of the whole of the sheet; $\lambda_d$ represents a coefficient of thermal conductivity of the thermally conductive material; $\lambda_c$ represents a coefficient of thermal conductivity of the matrix; and $\varphi$ represents a volume fraction of the thermally conductive material to the whole of the sheet.

Here, in the case of setting up the coefficient of thermal conductivity of the thermally conductive material at 10, 30, 50 and 70 W/mK, respectively, the relation between the filling amount $\varphi$ of the thermally conductive material and the coefficient of thermal conductivity $\lambda$ of the whole of the sheet was calculated according to the foregoing expression (1). A high molecular material was used as a material for forming the matrix, and its coefficient of thermal conductivity $\lambda_c$ was set up at 0.2 W/mK.

Results of the calculation are shown in FIG. 6. The abscissa of the characteristic shown in FIG. 6 is a filling amount $\varphi$ of the thermally conductive material in the sheet, and the ordinate is a coefficient of thermal conductivity $\lambda$ of the whole of the sheet. As is clear from FIG. 6, it is understood that irrespective of the coefficient of thermal conductivity (kind) of the thermally conductive material, the coefficient of thermal conductivity of the whole of the sheet is increased with an increase of the filling amount, in particular, when the filling factor is about 65 vol % or more, the coefficient of thermal conductivity of the whole of the sheet abruptly increases.

When the heat radiation effect of the electromagnetic wave suppressing and heat radiating sheet of Example 1 is evaluated on the basis of the calculation results of this FIG. 6, in Example 1, the maximum filling amount of the magnetic particle is about 70.9 vol %, a value of which exceeds 65 vol % at which the coefficient of thermal conductivity starts to abruptly increase. Therefore, it is understood from the results of FIG. 6 that the electromagnetic wave suppressing and heat radiating sheet of Example 1 has an excellent heat radiation effect.

Also, taking into consideration the results of FIG. 6, a preferred range of the {(tap density)/density} ratio of the magnetic powder in the embodiment according to the present invention is determined using FIG. 5. When a {(tap density)/density} ratio at a maximum filling amount of about 65 vol % at which the heat radiation effect starts to abruptly increase is determined from a bold dashed line in FIG. 5, its value is about 0.58. Therefore, from the evaluation results of FIGS. 5 and 6, it is understood that in the electromagnetic wave suppressing and heat radiating sheet of Example 1, when the {(tap density)/density} ratio of the magnetic particle is about 0.58 or more, the coefficient of thermal conductivity (heat radiation effect) of the sheet abruptly increases.

(3) Synthetic Evaluation of Electromagnetic Wave Suppression Effect and Heat Radiation Effect:

As described previously, the foregoing coefficient of thermal conductivity $\lambda$ of the whole of the sheet can be used as an index for evaluating the heat radiation effect of the electromagnetic wave suppressing and heat radiating sheet. On the other hand, an imaginary part $\mu_r''$ of a complex relative magnetic permeability $\mu_r$ (=$\mu_r'$−j$\mu_r''$) of the sheet is in general used for evaluating the electromagnetic wave suppression effect. The imaginary part $\mu_r''$ of the complex relative magnetic permeability $\mu_r$ is a parameter regarding a loss amount of magnetic energy. As the imaginary part $\mu_r''$ increases, the loss amount (absorption amount) of the magnetic energy in the sheet increases. That is, as the imaginary part $\mu_r''$ of the complex relative magnetic permeability $\mu_r$ of the sheet increases, the electromagnetic wave suppression effect becomes large.

In general, the complex relative magnetic permeability of an electromagnetic wave suppressing and heat radiating sheet is influenced by the filling amount of the magnetic material in the sheet, and there is, for example, the following relation therebetween according to the Lichtenecker's expression.

$$\log(\mu_r) = v_1 \times \log(\mu_{r1}) + v_2 \times \log(\mu_{r2}) \quad (2)$$

$$v_1 + v_2 = 1$$

In the foregoing expression (2), $\mu_r$ represents a complex relative magnetic permeability of the whole of the sheet; $\mu_{r1}$ represents a complex relative magnetic permeability of the magnetic material; $\mu_{r2}$ represents a complex relative magnetic permeability of the sheet matrix; $v_1$ represents a volume fraction of the magnetic material; and $v_2$ represents a volume fraction of the sheet matrix.

Then, in this Example 1, a parameter ($\mu_r'' \times \lambda$) is used as an index for evaluating both of the electromagnetic wave suppression effect and the heat radiation effect (hereinafter referred to as "electromagnetic wave suppression and heat radiation effect"). In this Example 1, a value of the imaginary part $\mu_r''$ at a frequency of 500 MHz is used as the imaginary part $\mu_r''$ of the complex relative magnetic permeability $\mu_r$. This frequency of 500 MHz is one of typical frequencies of a magnetic field emitted from, for example, a semiconductor package within an electronic appliance or the like. Also, the parameter $\lambda$ is a coefficient of thermal conductivity of the sheet.

In the electromagnetic wave suppressing and heat radiating sheet of Example 1 (Sample D), the imaginary part $\mu_r''$ of the complex relative magnetic permeability $\mu_r$ at a frequency of 500 MHz was 6.94, and the coefficient of thermal conductivity $\lambda$ was 2.2 (W/mK). That is, in the electromagnetic wave suppressing and heat radiating sheet of Example 1, the parameter ($\mu_r'' \times \lambda$) is equal to 15.268. On the other hand, the parameter ($\mu_r'' \times \lambda$) of the electromagnetic wave suppressing and heat radiating sheets of the Comparative Example (Samples A to C) was 11.143, 13.066 and 9.877, respectively, all of which values were smaller than that in Example 1.

Figure 7:
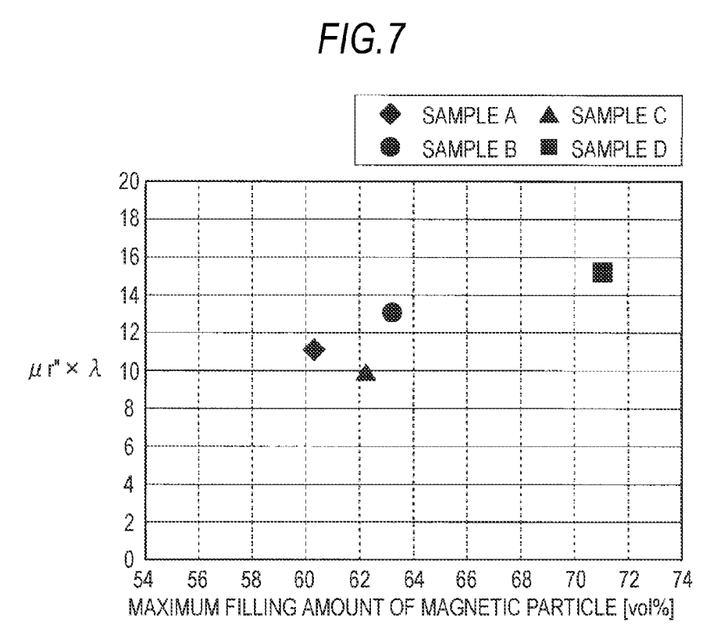
FIG. 7 is a graph showing a relation between a maximum filling amount of a magnetic particle and an electromagnetic wave suppression and heat radiation effect in an electromagnetic wave suppressing and heat radiating sheet of each of Example 1 and Comparative Example.

Also, a characteristic which expresses more specifically the relation between the maximum filling amount of each of the magnetic particles of Example 1 (Sample D) and Comparative Example (Samples A to C) and the electromagnetic wave suppression and heat radiation effect is shown in FIG. 7. The abscissa of the characteristic shown in FIG. 7 is a maximum filling amount of the magnetic particle, and the ordinate is a parameter ($\mu_r'' \times \lambda$) showing the electromagnetic wave suppression and heat radiation effect. As is clear from FIG. 7, it is understood that in the electromagnetic wave suppressing and heat radiating sheet, the electromagnetic wave suppression and heat radiation effect ($\mu_r'' \times \lambda$) is enhanced with an increase of the maximum filling amount of the magnetic particle.

Here, from a point of view different from the evaluation of the foregoing electromagnetic wave suppression and heat radiation effect (parameter ($\mu_r'' \times \lambda$)), the both effects including the electromagnetic wave suppression effect and the heat radiation effect are also synthetically evaluated.

In fact, in preparing an electromagnetic wave suppressing and heat radiating sheet, a blending ratio of the magnetic powder and the powder for heat radiation is frequently changed depending upon a use application or use place thereof or the like while considering which should attach importance between the electromagnetic wave suppression effect and the heat radiation effect. In that case, balance between the both effects changes depending upon the blending ratio. Here, the balance between the electromagnetic wave suppression effect and the heat radiation effect is evaluated, and even in this evaluation, what an electromagnetic wave suppressing and heat radiating sheet having excellent characteristics is obtainable in the embodiment according to the present invention as compared with the related art is described.

Figure 8:
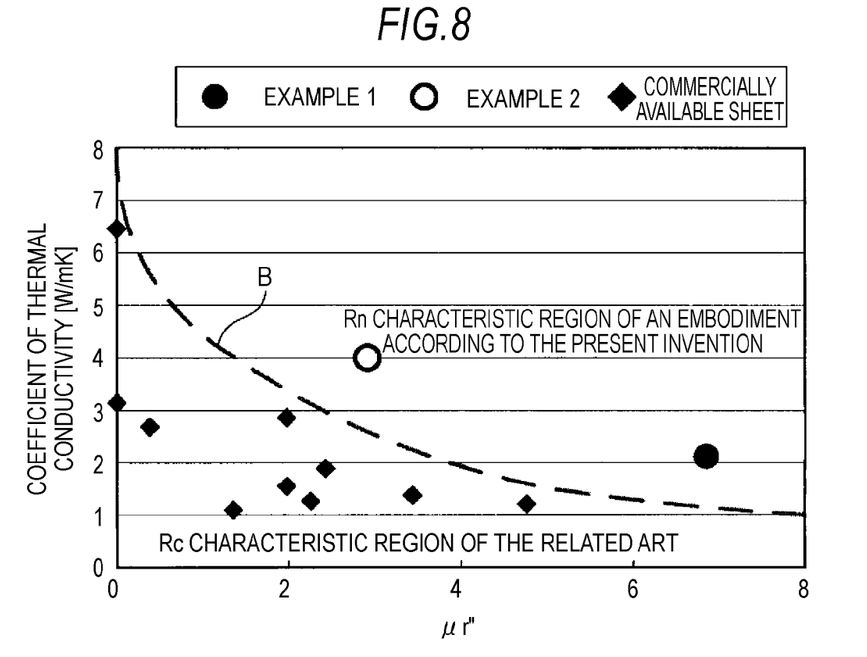
FIG. 8 is a graph showing a relation between an imaginary part of a complex relative magnetic permeability and a coefficient of thermal conductivity in each of electromagnetic wave suppressing and heat radiating sheets of Examples 1 and 2 and commercially available electromagnetic wave suppressing and heat radiating sheets.

FIG. 8 shows a graph of the characteristic comparison between the electromagnetic wave suppressing and heat radiating sheets prepared in Examples 1 and 2 and electromagnetic wave suppressing and heat radiating sheets which are commercially available at present or the like (hereinafter also referred to as "commercially available sheets"). FIG. 8 is concerned with a characteristic showing a relation between the electromagnetic wave suppression effect and the heat radiation effect in the electromagnetic wave suppressing and heat radiating sheet; and the abscissa of the FIG. 8 is an imaginary part $\mu_r''$ of a complex relative magnetic permeability of the sheet at a frequency of 500 MHz, and the ordinate is a coefficient of thermal conductivity $\lambda$ of the sheet. That is, the abscissa of FIG. 8 is an index showing the electromagnetic wave suppression effect, and the ordinate is an index showing the heat radiation effect. A black dot in FIG. 8 shows a characteristic of Example 1; a white circle shows a characteristic of Example 2 as described later; and a black rhombus shows a characteristic of each of commercially available sheets. However, in the characteristics of the commercially available sheets in FIG. 8, a characteristic of a heat radiation sheet which does not contain a magnetic material is also shown for reference (data of an imaginary $\mu_r''=0$ in FIG. 8).

As is clear from FIG. 8, in the electromagnetic wave suppressing and heat radiating sheet, it is understood that as the imaginary $\mu_r''$ of the complex relative magnetic permeability (electromagnetic wave suppression effect) increases, the coefficient of thermal conductivity $\lambda$ (heat radiation effect) is lowered. Inversely, it is also understood that as the coefficient of thermal conductivity $\lambda$ (heat radiation effect) increases, the imaginary $\mu_r''$ of the complex relative magnetic permeability (electromagnetic wave suppression effect) is lowered. This is chiefly caused due to the fact that a proportion of the filling amount of the magnetic particle and the filling amount of the particle for heat radiation in the sheet changes.

Also, as is clear from FIG. 8, the characteristics of the commercially available sheets are present in a region Rc (region on the left lower side than a boundary line B expressed by a broken line in FIG. 8) where the heat radiation effect or electromagnetic wave suppression effect is lower than the boundary line B. This boundary line B shows an upper limit level of the characteristic obtained in the electromagnetic wave suppressing and heat radiating sheets which are commercially available at present, and the characteristics of the electromagnetic wave suppressing and heat radiating sheets which are commercially available at present are present in the region Rc.

On the contrary, in FIG. 8, a region Rn on the right upper side than the boundary line B is a region where the heat radiation effect and/or the electromagnetic wave suppression effect is larger than that of the existing sheets and, considering the balance of these effects, is a region where characteristics with high performances are obtained as compared with the related art. Therefore, it is understood from FIG. 8 that in the case of synthetically evaluating the electromagnetic wave suppression effect and the heat radiation effect, the electromagnetic wave suppressing and heat radiating sheet of Example 1 having the characteristic within the region Rn is an electromagnetic wave suppressing and heat radiating sheet with high performances as compared with the related art.

3. Example 2

In Example 2, in order to more enhance the heat radiation effect, an electromagnetic wave suppressing and heat radiating sheet was prepared by mixing not only a magnetic powder but a powder for heat radiation with a matrix. In this Example 2, an electromagnetic wave suppressing and heat radiating sheet was prepared in the same manner as in Example 1, except for further mixing a powder for heat radiation.

In this Example 2, a powder of aluminum nitride having an average particle size of about 1 µm and a powder of alumina having an average particle size of about 0.2 µm were used as the powder for heat radiation.

Also, similar to Example 1, a magnetic powder (magnetic metal amorphous powder) having a {(tap density)/density} ratio of approximately 0.63 and an average particle size of about 10 µm was used as the magnetic powder. Furthermore, similar to Example 1, a silicone based resin composed of a mixture of a polyalkylalkenylsiloxane, a polyalkyl hydrogen siloxane and a platinum compound was used as the matrix.

In this Example 2, since the powder for heat radiation is mixed chiefly for the purpose of increasing a coefficient of thermal conductivity, the magnetic particle is not filled to an extent of the maximum filling amount as in Example 1. Also, in this Example 2, an electromagnetic wave suppressing and heat radiating sheet was prepared while studying an optimal blending ratio of the three kinds of powders made of a different material and having a different particle size.

As a result, in this Example 2, the total sum of filling amounts (maximum filling amount) of the three kinds of target particles could be regulated at about 80 vol %. More specifically, for example, the magnetic particle, the aluminum nitride and the alumina particle could be filled in amounts of about 60 vol %, about 16 vol % and about 4 vol %, respectively. As described previously, taking into consideration the fact that when spheres having a uniform size are subjected to closest packing, a theoretical filling factor is 0.74, it is understood that in the electromagnetic wave suppressing and heat radiating sheet of this Example 2, the filling amount of the target particles is very high.

Also, in the case of mixing the three kinds of powders in the foregoing blending ratio, an imaginary part $\mu_r''$ of a complex relative magnetic permeability $\mu_r$ of the sheet at a frequency of 500 MHz was 3.0, and a coefficient of thermal conductivity $\lambda$ of the sheet was 4.0 (W/mK). That is, in this Example 2, the coefficient of thermal conductivity $\lambda$ which is larger than that in Example 1 could be obtained.

Also, as is clear from the characteristic showing a relation between the electromagnetic wave suppression effect and the heat radiation effect in the electromagnetic wave suppressing and heat radiating sheet shown in FIG. 8, the characteristic of the electromagnetic wave suppressing and heat radiating sheet of Example 2 is present in the region Rn in FIG. 8. Therefore, it is understood that in the case of synthetically evaluating the electromagnetic wave suppression effect and the heat radiation effect, the electromagnetic wave suppressing and heat radiating sheet of Example 2 is also an electromagnetic wave suppressing and heat radiating sheet with high performances as compared with the related art.

In the foregoing Examples 1 and 2, while an example using a magnetic metal amorphous powder as the magnetic powder has been described, it should not be construed that the present invention is limited thereto. According to verification experiments made by the present inventors, even by using a crystallized metal powder, a metal alloy powder, a ferrite powder or the like as the magnetic powder, in the case where the {(tap density)/density} ratio of such a powder is about 0.58 or more, the same results were obtained. On that occasion, the same matrix as in the foregoing Examples 1 and 2 could be used for the matrix.

In the light of the above, when the composition for electromagnetic wave suppression and heat radiation according to the embodiment of the present invention is prepared by mixing a magnetic powder having a relation of {(tap density)/density} 0.5, or such a magnetic powder and a thermally conductive powder with a matrix, characteristics which are excellent in both of an electromagnetic wave suppression action and a heat radiation action are obtained.

Also, in the embodiment according to the present invention, by regulating a mixing ratio of the magnetic powder and the thermally conductive powder, balance between the electromagnetic wave suppression action and the heat radiation action can be easily regulated. Therefore, the composition for electromagnetic wave suppression and heat radiation can be applied to all applications.

The present application contains subject matter related to that disclosed in Japanese Priority Patent Application JP 2009-027744 filed in the Japan Patent Office on Feb. 9, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A composition comprising:
    a matrix;
    magnetic particles in the matrix, the magnetic particles having a relation of $\{(\text{tap density})/\text{density}\} \geq 0.58$ with respect to the matrix; and
    thermally conductive particles in the matrix, the thermally conductive particles having a relation of $\{(\text{tap density})/\text{density}\} \geq 0.58$ with respect to the matrix,
    wherein,
        the magnetic particles are effective to suppress electromagnetic waves and the thermally conductive particles are effective to cause the composition to radiate heat.

2. The composition of claim 1, wherein the magnetic particles are amorphous metal particles.

3. The composition of claim 1, wherein the magnetic particles are at least one of crystallized metal particles and metal alloy particles.

4. The composition of claim 1, wherein the magnetic particles are ferrite particles.

5. The composition of claim 1, wherein the thermally conductive particles are at least one member selected from the group consisting of a powder of a thermally conductive ceramic, a metal powder and a metal powder coated with an insulating material.

6. A molded article made of the composition of claim 1.

7. The article of claim 6, wherein the article is a member in a sheet form.

8. A paste comprising the composition of claim 1.

9. A gel comprising the composition of claim 1.

10. A method for manufacturing a composition for electromagnetic wave suppression and heat radiation comprising the steps of:
    obtaining a magnetic powder having a relation of $\{(\text{tap density})/\text{density}\} \geq 0.58$ with respect to a matrix;
    mixing the magnetic powder into the matrix; and
    mixing a thermally conductive powder into the matrix, wherein,
        the thermally conductive powder has a relation of $\{(\text{tap density})/\text{density}\} \geq 0.58$ with respect to the matrix.

11. The composition of claim 1, wherein the magnetic particles comprise boron.

12. The composition of claim 1, wherein the magnetic particles comprise carbon.

13. The method of claim 10, wherein the magnetic powder is an amorphous metal powder.

14. The method of claim 10, wherein the magnetic powder is at least one of a crystallized metal power and a metal alloy powder.

15. The method of claim 10, wherein the magnetic powder is a ferrite powder.

16. The method of claim 10, wherein the thermally conductive powder is at least one member selected from the group consisting of a powder of a thermally conductive ceramic, a metal powder and a metal powder coated with an insulating material.

17. The method of claim 10, further comprising forming the composition for electromagnetic wave suppression and heat radiation into a molded article.

18. The method of claim 17, wherein the molded article is a member in a sheet form.

19. The method of claim 10, further comprising forming the composition for electromagnetic wave suppression and heat radiation into a paste.

20. The method of claim 10, wherein the magnetic powder comprises boron.

21. The method of claim 10, wherein the magnetic powder comprises carbon.

* * * * *